(12) United States Patent  
Gill

(10) Patent No.: US 6,185,079 B1
(45) Date of Patent: Feb. 6, 2001

(54) DISK DRIVE WITH THERMAL ASPERITY REDUCTION CIRCUITRY USING A MAGNETIC TUNNEL JUNCTION SENSOR

(75) Inventor: Hardayal Singh Gill, Portola Valley, CA (US)

(73) Assignee: International Business Machines Corporation, Armonk, NY (US)

( * ) Notice: Under 35 U.S.C. 154(b), the term of this patent shall be extended for 0 days.

(21) Appl. No.: 09/189,321

(22) Filed: Nov. 9, 1998

(51) Int. Cl.$^7$ ....................................................... G11B 5/39
(52) U.S. Cl. ............................................................ 360/324.2
(58) Field of Search ................................. 360/324.2, 314

(56) References Cited

U.S. PATENT DOCUMENTS

| | | | |
|---|---|---|---|
| 5,193,038 | 3/1993 | Smith | 360/113 |
| 5,442,508 | 8/1995 | Smith | 360/113 |
| 5,465,185 | 11/1995 | Heim et al. | 360/113 |
| 5,576,915 * | 11/1996 | Akiyama et al. | 360/113 |
| 5,627,703 | 5/1997 | Smith | 360/113 |
| 5,636,093 | 6/1997 | Gijs et al. | 360/126 |
| 5,701,222 * | 12/1997 | Gill et al. | 360/113 |
| 5,751,521 * | 5/1998 | Gill | 360/113 |
| 5,793,207 | 8/1998 | Gill | 324/252 |
| 5,793,576 | 8/1998 | Gill | 360/113 |
| 5,825,595 * | 10/1998 | Gill | 360/113 |
| 5,828,529 | 10/1998 | Gill | 360/113 |
| 5,859,753 * | 1/1999 | Ohtsuka et al. | 360/113 |
| 5,859,754 * | 1/1999 | Tong et al. | 360/113 |
| 5,898,548 | 4/1999 | Dill et al. | 360/113 |

FOREIGN PATENT DOCUMENTS

| | | |
|---|---|---|
| 19701509 | 7/1997 | (DE) . |
| 0755048A1 | 1/1997 | (EP) . |
| 0768643A2 | 4/1997 | (EP) . |
| 0872828A2 | 10/1998 | (EP) . |
| 11163436 | 6/1999 | (JP) . |
| 410789 | 6/1999 | (JP) . |

\* cited by examiner

*Primary Examiner*—Craig A. Renner
*Assistant Examiner*—Angel Castro
(74) *Attorney, Agent, or Firm*—William D. Gill

(57) ABSTRACT

A disk drive system having a magnetic tunnel junction (MTJ) sensor having two MTJ stacks between first and second shields and a common electrode disposed between the two MTJ stacks. A first sense current is provided to the first MTJ stack by the first shield and the common electrode and a second sense current is provided to the second MTJ stack by the second shield and the common electrode. The magnetization directions of the pinned layers of the first and second MTJ stacks are fixed perpendicular to the ABS and antiparallel with respect to each other so that the magnetoresistive signal generated due to an external field from a disk by the first MTJ stack differs in phase by 180° with respect to the magnetoresistive signal generated due to the same external field by the second MTJ stack. The voltages developed across the two MTJ stacks (voltages due to the presence of thermal asperities and voltages due to the presence of data fields) are applied to the inputs of a differential amplifier for substantial elimination of the thermal asperity signal.

37 Claims, 11 Drawing Sheets

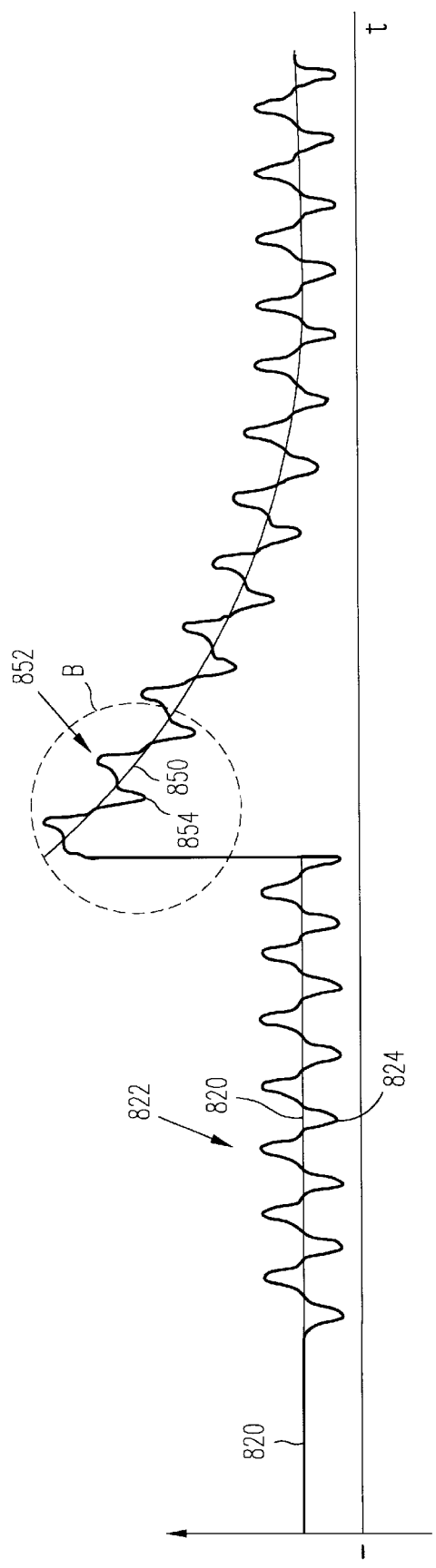

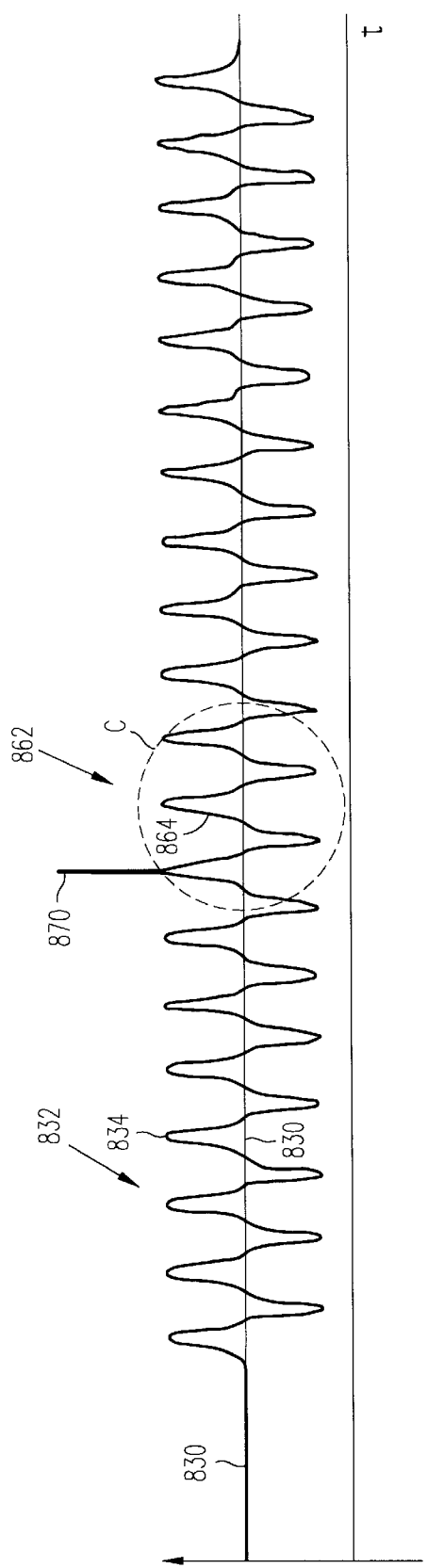

DISK DRIVE WITH THERMAL ASPERITY REDUCTION CIRCUITRY USING A MAGNETIC TUNNEL JUNCTION SENSOR

BACKGROUND OF THE INVENTION

1. Field of the Invention

This invention relates in general to a direct access storage device (DASD) of the type utilizing magnetoresistive read sensors for reading signals recorded in a magnetic medium and, more particularly, it relates to a DASD having a novel magnetic tunnel junction (MTJ) sensor for minimizing the effect of thermal asperities.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read sensors, commonly referred to as MR heads, are the prevailing read sensor because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material (e.g., Ni—Fe or Co or Ni—Fe—Co of Ni—Fe/Co) separated by a layer of non-magnetic material (e.g., copper) are generally referred to as spin valve (SV) sensors manifesting the SV effect.

FIG. 1 shows a prior art SV sensor 100 comprising end regions 104 and 106 separated by a central region 102. A first ferromagnetic layer, referred to as a pinned layer 120, has its magnetization typically fixed (pinned) by exchange coupling with an antiferromagnetic (AFM) layer 125. The magnetization of a second ferromagnetic layer, referred to as a free layer 110, is not fixed and is free to rotate in response to the magnetic field from the recorded magnetic medium (the signal field). The free layer 110 is separated from the pinned layer 120 by a non-magnetic, electrically conducting spacer layer 115. Hard bias layers 130 and 135 formed in the end regions 104 and 106, respectively, provide longitudinal bias for the free layer 110. Leads 140 and 145 formed on hard bias layers 130 and 135, respectively, provide electrical connections for sensing the resistance of the SV sensor 100. IBM's U.S. Pat. No. 5,206,590 granted to Dieny et al., incorporated herein by reference, discloses a GMR sensor operating on the basis of the SV effect.

Another type of magnetic device currently under development is a magnetic tunnel junction (MTJ) device. The MTJ device has potential applications as a memory cell and as a magnetic field sensor. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ sensor, one ferromagnetic layer has its magnetic moment fixed, or pinned, and the other ferromagnetic layer has its magnetic moment free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a corresponding change in the sensed current or voltage. IBM's U.S. Pat. No. 5,650,958 granted to Gallagher et al., incorporated in its entirety herein by reference, discloses an MTJ sensor operating on the basis of the magnetic tunnel junction effect.

FIG. 2 shows a prior art MTJ sensor 200 comprising a first electrode 204, a second electrode 202, and a tunnel barrier 215. The first electrode 204 comprises a pinned layer (pinned ferromagnetic layer) 220, an antiferromagnetic (AFM) layer 230, and a seed layer 240. The magnetization of the pinned layer 220 is fixed through exchange coupling with the AFM layer 230. The second electrode 202 comprises a free layer (free ferromagnetic layer) 210 and a cap layer 205. The free layer 210 is separated from the pinned layer 220 by a non-magnetic, electrically insulating tunnel barrier layer 215. In the absence of an external magnetic field, the free layer 210 has its magnetization oriented in the direction shown by arrow 212, that is, generally perpendicular to the magnetization direction of the pinned layer 220 shown by arrow 222 (tail of the arrow that is pointing into the plane of the paper). A first lead 260 and a second lead 265 formed in contact with first electrode 204 and second electrode 202, respectively, provide electrical connections for the flow of sensing current $I_s$ from a current source 270 to the MTJ sensor 200. A signal detector 280, typically including a recording channel such as a partial-response maximum-likelihood (PRML) channel, connected to the first and second leads 260 and 265 senses the change in resistance due to changes induced in the free layer 210 by the external magnetic field.

As mentioned earlier, an MR sensor exhibits a change in resistance when in the presence of a changing magnetic field. This resistance change is transformed into a voltage signal by passing a constant sense current through the MR element. The value of the DC voltage for a given MR sensor is the product of the constant sense current and the total resistance between the MR sensor leads. Since the change in the resistance is the principal upon which the MR sensor operates, the change in resistance can substantially effect the performance of the MR sensor and the disk drive incorporating the MR sensor.

A phenomena, known as a thermal asperity (TA), can suddenly increase the MR sensor temperature by more than 100 degrees C. The cause of this sudden temperature rise is a collision or near collision of the MR sensor with a protrusion on the disk surface while reading information from a track. The collision causes the DC base voltage of the MR sensor to shift substantially thus making the information unreadable.

FIG. 3 is a graph illustrating the DC base (bias) voltage 310, the thermal asperity voltage 320, which is the shift and decay in the base DC voltage 310, the data signal 335 read back from the disk in the absence of the thermal asperity 320, and the data signal 340 read back from the disk in the presence of the thermal asperity 320. Note that the thermal asperity 320 comprises a sudden shift 325 in the DC base voltage followed by an exponential decay 330 in the DC base voltage. The exponential decay 330 in the DC base voltage continues until the DC base voltage 310 is reached. It should be noted that the sudden shift 325 in the DC base voltage could be several times larger than the data signal 335 causing the electrical circuitry connected directly or indirectly to the MR sensor to saturate leading to the loss of the data. The loss of the data, depending on the size of the thermal asperity 320, could very easily be several bytes long, each byte being eight bits long.

Known arrangements in disk drives for minimizing the effect of thermal asperity on the read data utilize either a separate asperity reduction circuit (ARC) module which is costly or a complicated data channel (such as modified partial-response maximum likelihood channel) having a normal operating mode and an asperity recovery mode.

MR sensors and spin valve sensors with thermal asperity reduction circuitry to compensate for the effect of thermal asperities are described in IBM's U.S. Pat. No. 5,793,576 to Gill and in IBM's U.S. Pat. No. 5,793,207 to Gill, respectively, the contents of which are incorporated herein by reference. These applications describe sensors having four leads, two leads for providing sense current to the MR or SV sensor and two leads for providing current to an asperity compensation layer. The voltages developed across the MR or SV element (voltages due to the presence of thermal asperities and voltages due to the presence of data fields) and the asperity compensation layer (voltages due to the presence of thermal asperities) are applied to the inputs of a differential amplifier for substantial elimination of the thermal asperity signal.

Thermal asperities present similar problems for MTJ sensors as for MR and SV sensors. The MTJ sensor resistance changes as the spin dependent tunneling current through the tunnel barrier layer in the sensor changes due to the magnetic field of the data recorded on the disk. The base resistance of the MTJ sensor due to a constant bias voltage applied across the tunnel barrier layer decreases when a thermal asperity causes an increase of the temperature of the tunnel barrier layer. The resulting exponentially decaying thermal asperity signal interferes with detection of the superimposed data signal.

Therefore, there is a need for an invention that minimizes the effect of thermal asperities for MTJ sensors without utilizing a complicated recording channel or a separate ARC module.

SUMMARY OF THE INVENTION

It is an object of the present invention to disclose a magnetic tunnel junction (MTJ) sensor for substantially eliminating the thermal asperity phenomena in disk drives utilizing MTJ sensors.

It is another object of the present invention to disclose a method and means for detecting and substantially eliminating the thermal asperity phenomena in disk drives utilizing MTJ sensors.

These and other objects and advantages are attained in accordance with the principles of the present invention by a magnetic tunnel junction (MTJ) sensor having a first MTJ stack separated from a second MTJ stack by a common electrode. Electrodes for providing sense current to the first MTJ stack and to the second MTJ stack are provided by a first shield and a second shield, respectively.

The first MTJ stack has a free layer separated from a pinned layer by a tunnel barrier layer. An AFM layer adjacent to the pinned layer provides an exchange field to fix (pin) the magnetization of the pinned layer perpendicular to the ABS. The magnetization of the free layer is oriented parallel to the ABS and is free to rotate in the presence of a signal magnetic field.

Similarly, the second MTJ stack has a free layer separated from a pinned layer by a tunnel barrier layer. An AFM layer adjacent to the pinned layer provides an exchange field to fix (pin) the magnetization of the pinned layer perpendicular to the ABS and antiparallel to the magnetization direction of the pinned layer of the first MTJ stack. The magnetization of the free layer is oriented parallel to the ABS and is free to rotate in the presence of a signal magnetic field.

With the magnetizations of the pinned layers of the two MTJ stacks fixed perpendicular to the ABS and antiparallel with respect to each other, the magnetoresistive signal generated due to an external field from the disk by the first MTJ stack will differ in phase by 180° with respect to the magnetoresistive signal generated due to the same external field by the second MTJ stack.

The free layer of the first MTJ stack and the free layer of the second MTJ stack are both adjacent to the common electrode that is disposed between the first and second MTJ stacks. A first current source connected to the first shield and the common electrode provides sense current to the first MTJ stack and a second current source connected to the second shield and the common electrode provides sense current to the second MTJ stack. Under DC conditions (no signal field), the currents flowing in each MTJ stack are adjusted so that the product of the current flowing in the first MTJ stack and the resistance of the first MTJ stack is equal to the product of the current flowing through the second MTJ stack and the resistance of the second MTJ stack. The voltage developed across the first MTJ stack is fed into the first input terminal of a differential circuit and the voltage developed across the second MTJ stack is fed into the second input terminal of the differential circuit. The differential circuit further has an output terminal and a ground (common) terminal.

In the presence of a thermal asperity, the resistance of both MTJ stacks change and because the currents were adjusted to give equal products of current and resistance across each MTJ stack, the thermal asperity signal developed across the first MTJ stack and the thermal asperity signal developed across the second MTJ stack are substantially of the same shape, magnitude and phase. However, in the presence of a data field from the disk, the magnetoresistive signal generated across the first MTJ stack differs in phase by 180° with respect to the magnetoresistive signal generated across the second MTJ stack.

Since the thermal asperity signal is present and common at both input terminals of the differential circuit, it will be cancelled by the differential circuit. However the magnetoresistive signals due to the data field on the disk differ in phase by 180° at the two input terminals resulting in an output signal equal to the sum of the magnetoresistive signals at the two input terminals.

The above as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

FIGS. 8a, 8b and 8c are graphs illustrating the signals at the input terminals and the output terminal of the differential circuit in the preferred embodiment of the present invention in the absence of thermal asperity and data signal, in the absence of thermal asperity and the presence of data signal, and in the presence of thermal asperity and data signal;

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 1:
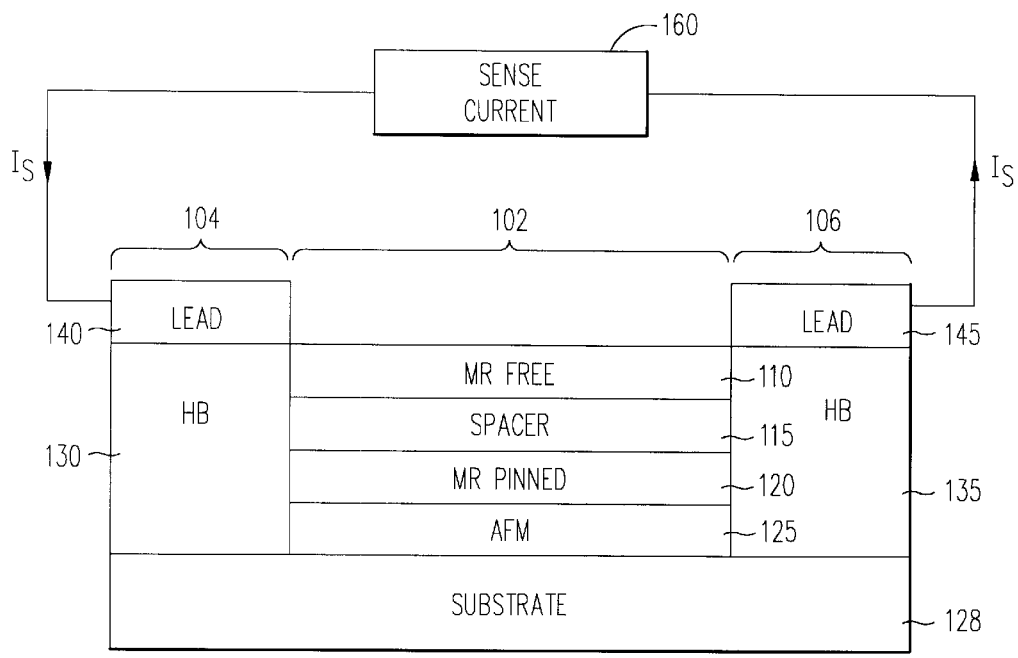
FIG. 1 is an air bearing surface view, not to scale, of a prior art SV sensor.
Figure 4:
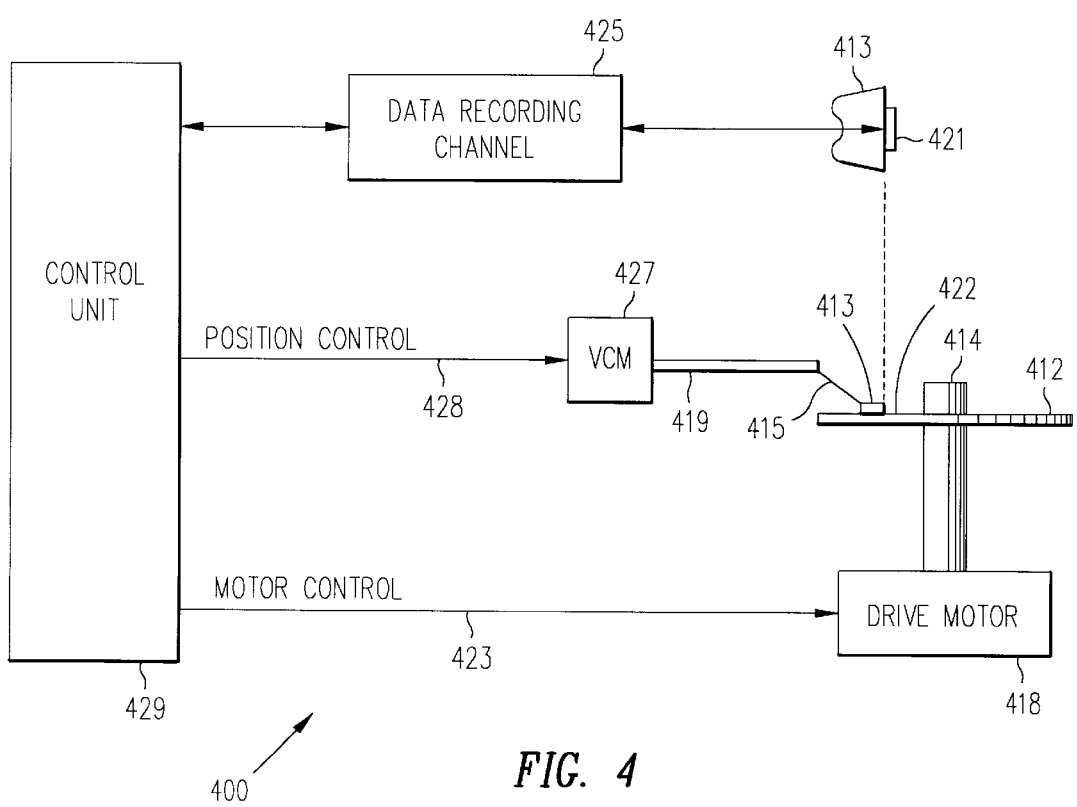
FIG. 4 is a simplified diagram of a magnetic recording disk drive system.
Figure 2:
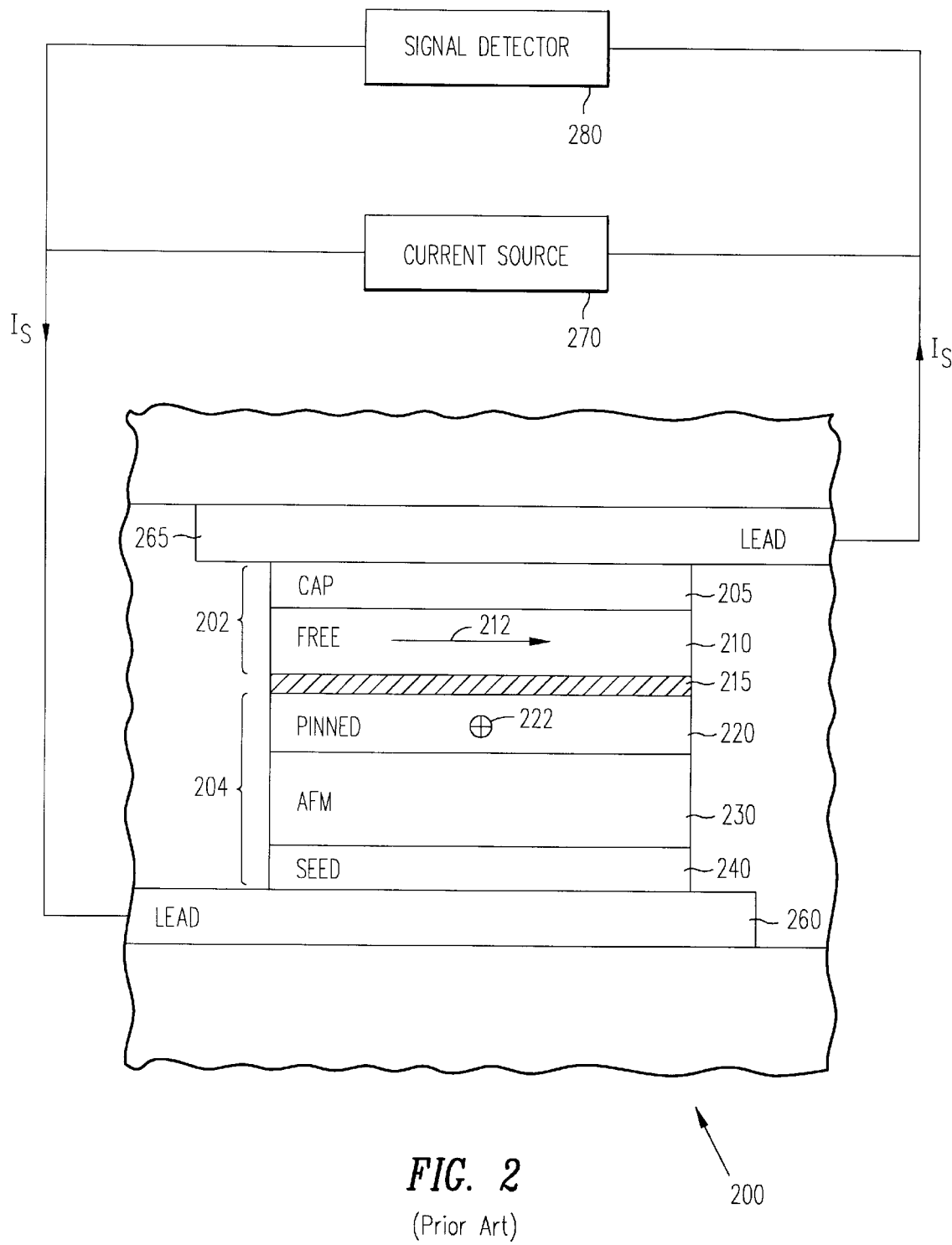
FIG. 2 is an air bearing surface view, not to scale, of a prior art MTJ sensor.
Figure 3:
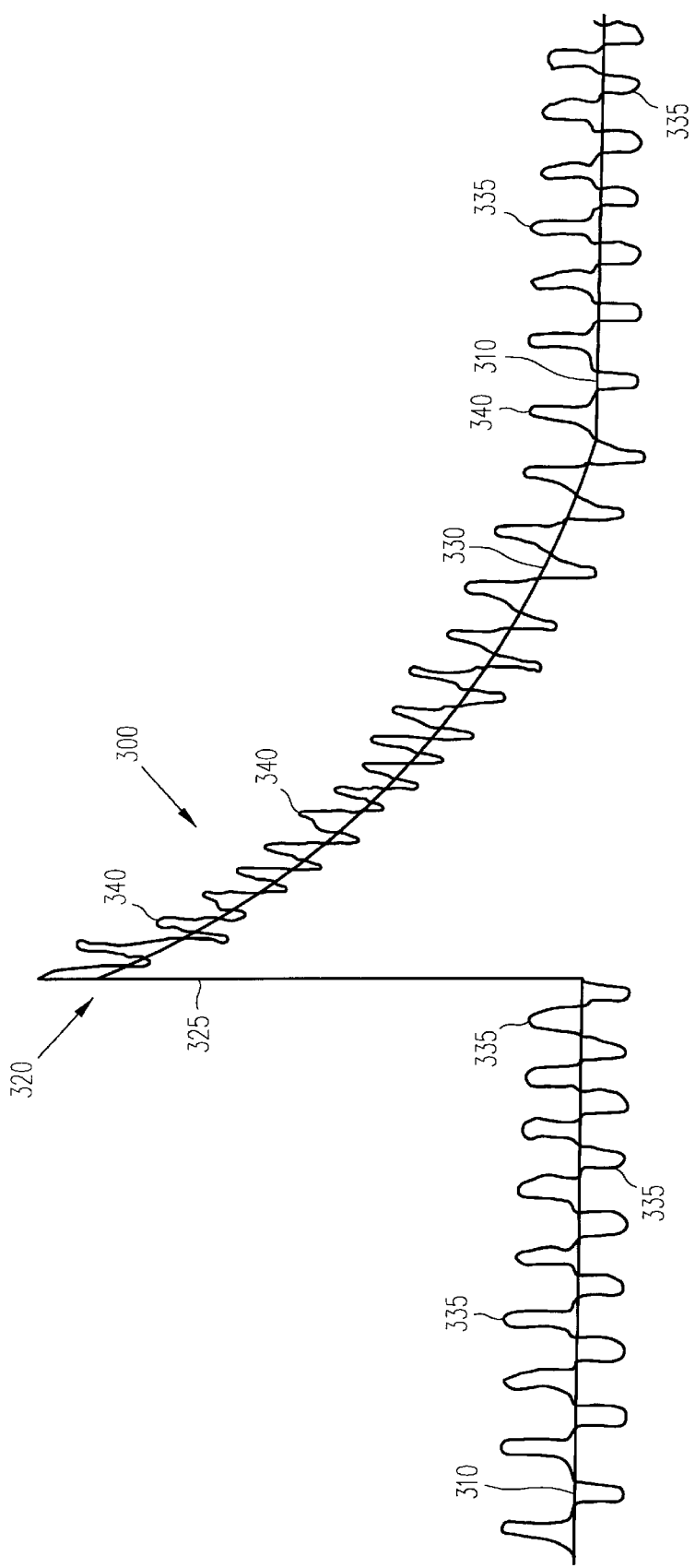
FIG. 3 is a graph showing a thermal asperity signal and the data signal read back from a data track.

Referring now to FIG. 4, there is shown a disk drive 400 embodying the present invention. As shown in FIG. 4, at least one rotatable magnetic disk 412 is supported on a spindle 414 and rotated by a disk drive motor 418. The magnetic recording media on each disk is in the form of an annular pattern of concentric data tracks (not shown) on the disk 412.

At least one slider 413 is positioned on the disk 412, each slider 413 supporting one or more magnetic read/write heads 421 where the head 421 incorporates the MTJ sensor of the present invention. As the disks rotate, the slider 413 is moved radially in and out over the disk surface 422 so that the heads 421 may access different portions of the disk where desired data is recorded. Each slider 413 is attached to an actuator arm 419 by means of a suspension 415. The suspension 415 provides a slight spring force which biases the slider 413 against the disk surface 422. Each actuator arm 419 is attached to an actuator 427. The actuator as shown in FIG. 4 may be a voice coil motor (VCM). The VCM comprises a coil movable within a fixed magnetic field, the direction and speed of the coil movements being controlled by the motor current signals supplied by a controller 429.

During operation of the disk storage system, the rotation of the disk 412 generates an air bearing between the slider 413 (the surface of the slider 413 which includes the head 421 and faces the surface of the disk 412 is referred to as an air bearing surface (ABS)) and the disk surface 422 which exerts an upward force or lift on the slider. The air bearing thus counter-balances the slight spring force of the suspension 415 and supports the slider 413 off and slightly above the disk surface by a small, substantially constant spacing during normal operation.

The various components of the disk storage system are controlled in operation by control signals generated by the control unit 429, such as access control signals and internal clock signals. Typically, the control unit 429 comprises logic control circuits, storage chips and a microprocessor. The control unit 429 generates control signals to control various system operations such as drive motor control signals on line 423 and head position and seek control signals on line 428. The control signals on line 428 provide the desired current profiles to optimally move and position the slider 413 to the desired data track on the disk 412. Read and write signals are communicated to and from the read/write heads 421 by the recording channel 425. Recording channel 425 may be a partial response maximum likelihood (PMRL) channel or a peak detect channel. The design and implementation of both channels are well known in the art and to persons skilled in the art. In the preferred embodiment, recording channel 425 is a PMRL channel.

The above description of a typical magnetic disk storage system, and the accompanying illustration of FIG. 4 are for representation purposes only. It should be apparent that disk storage systems may contain a large number of disks and actuators, and each actuator may support a number of sliders.

Figure 5:
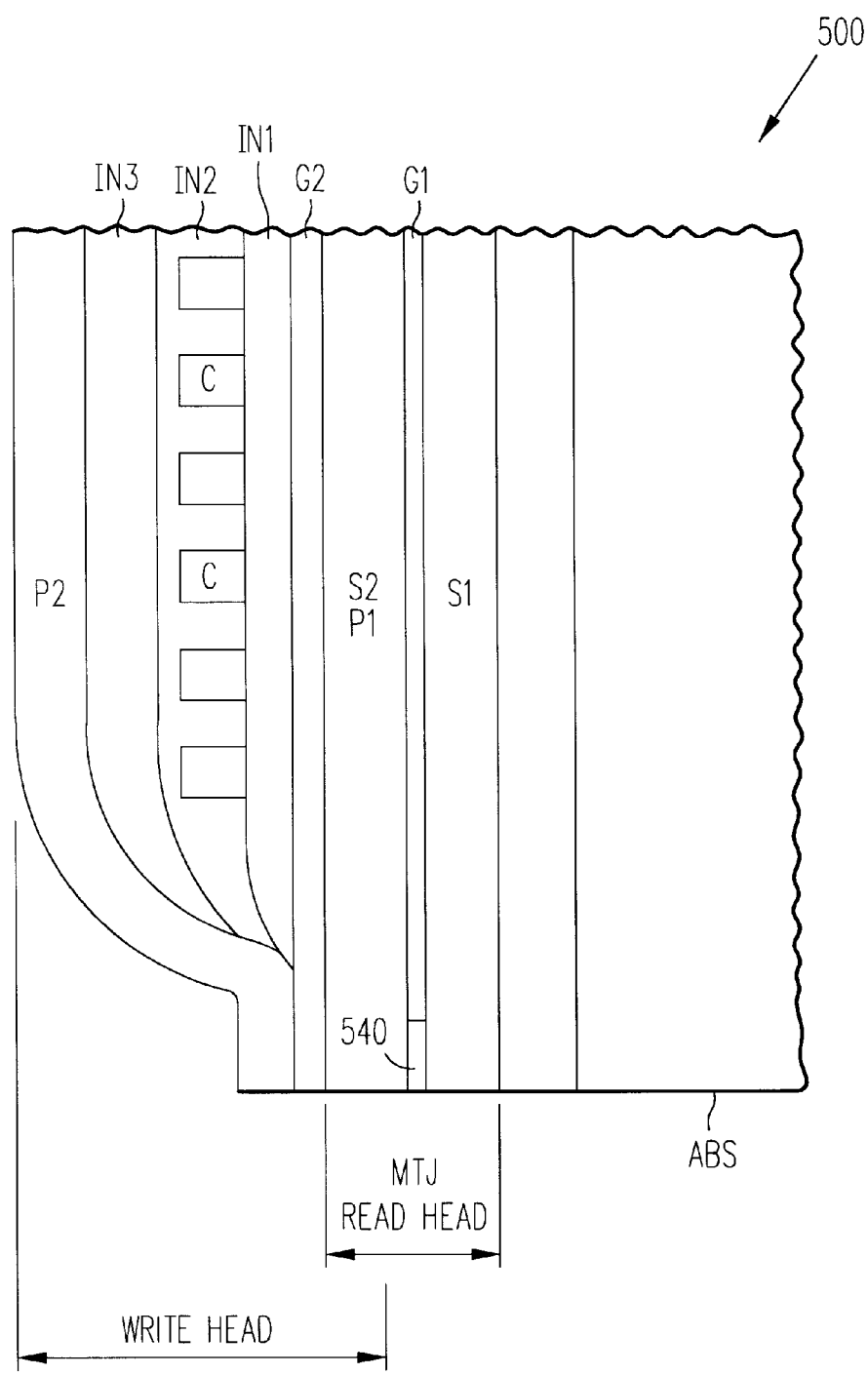
FIG. 5 is a vertical cross-section view, not to scale, of an inductive write/MR read head with the MR read head located between shields and adjacent to the inductive write head.

FIG. 5 shows a cross-sectional schematic view of the read/write head 500 embodying the present invention which includes an MTJ read head portion and an inductive write head portion. The head 500 is lapped to form an ABS. The read head includes an MTJ sensor 540 disposed between first and second shield layers S1 and S2. An insulating gap layer G1 is disposed between the first and second shield layers S1 and S2 in the region away from the MTJ sensor. The write head includes a coil layer C and an insulation layer IN2 which are disposed between insulation layers IN1 and IN3 which are, in turn, disposed between first and second pole pieces P1 and P2. A gap layer G2 is disposed between the first and second pole pieces P1, P2 for providing a magnetic gap at their pole tips adjacent to the ABS for providing a write gap. The combined read/write head 500 shown in FIG. 5 is a "merged" head in which the second shield layer S2 of the read head is employed as a first pole piece P1 for the write head. Alternatively, a "piggyback" head may be used in which the second shield layer S2 of the read head is a separate and distinct layer from the layer forming the first pole piece P1 for the write head.

Figure 6:
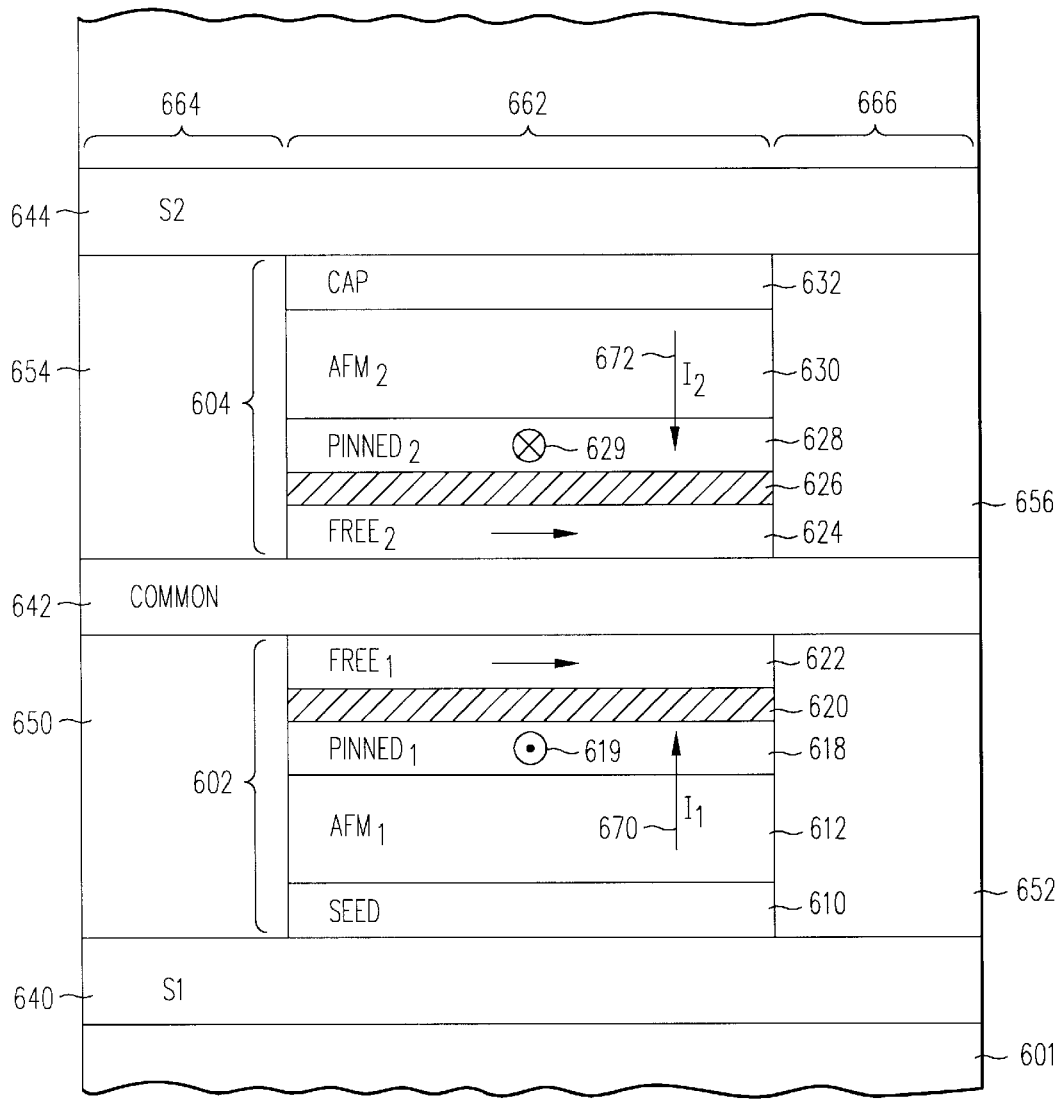
FIG. 6 is an air bearing surface view, not to scale, of an embodiment of the magnetic tunnel junction sensor of the present invention.

FIG. 6 shows an air bearing surface (ABS) view, not to scale, of an MTJ sensor 600 according to the preferred embodiment of the present invention. The MTJ sensor 600 comprises passive end regions 664 and 666 separated from each other by an active central region 662. The active region of the MTJ sensor 600 comprises a first MTJ stack 602 and a second MTJ stack 604 formed in the central region 662. A common electrode layer 642 of electrically conducting material such as gold disposed between the first MTJ stack 602 and the second MTJ stack 604 is formed in the central region 662 and in the end regions 664, 666. The first MTJ stack is formed directly on a first shield (S1) 640 in the central region 662. The first shield 640 is a layer of soft ferromagnetic material such as Ni—Fe (permalloy), or alternatively Al—Fe—Si (Sendust), deposited on a substrate 601 and extending over the central region 662 and the end regions 664 and 666 to provide magnetic shielding of the MTJ sensor 600 from stray magnetic fields. First insulator layers 650 and 652 of electrically insulating material such as $Al_2O_3$ are formed in end regions 664 and 666, respectively, on the first shield 640 and in abutting contact with the first MTJ stack 602. Second insulator layers 654 and 656 of electrically insulating material such as $Al_2O_3$ are formed in end regions 664 and 666, respectively, on the common electrode layer 642 and in abutting contact to the second MTJ stack 604. A second shield (S2) 644 of soft ferromagnetic material such as Ni—Fe, or alternatively Al—Fe—Si, is formed over the second insulator layers 654 and 656 in the end regions 664 and 666, respectively, and over the second MTJ stack 604 in the central region 662.

If longitudinal stabilization of the magnetic domain states of the free layers of the MTJ1 and MTJ2 stacks 602 and 604 is desired, hard bias layers may be provided within the first insulator layers 650 and 652 and the second insulator layers 654 and 656 as is known in the art. IBM's U.S. Pat. No. 5,720,410 granted to Fontana et al., and incorporated herein by reference, describes such a longitudinal biasing method for an MTJ sensor.

The first MTJ stack 602 comprises a ferromagnetic first free layer 622, a ferromagnetic first pinned layer 618, a first tunnel barrier layer 620 disposed between the first free layer 622 and the first pinned layer 618, a seed layer 610 and a first antiferromagnetic layer (AFM1) 612 disposed between the first pinned layer 618 and the seed layer 610. The AFM1 layer 612 is exchange coupled to the first pinned layer 618 providing an exchange field to pin the magnetization direction of the first pinned layer 618 perpendicular to the ABS. The magnetization of the first free layer 622 is oriented parallel to the ABS and is free to rotate in the presence of a signal magnetic field.

The second MTJ stack 604 comprises a ferromagnetic second free layer 624, a ferromagnetic second pinned layer 628, a second tunnel barrier layer 626 disposed between the second free layer 624 and the second pinned layer 628, a cap layer 632 and a second antiferromagnetic layer (AFM2) 630 disposed between the second pinned layer 628 and the cap layer 632. The AFM2 layer 622 is exchange coupled to the second pinned layer 628 providing an exchange field to pin the magnetization direction of the second pinned layer 628 perpendicular to the ABS. The magnetization of the second free layer 624 is oriented parallel to the ABS and is free to rotate in the presence of a signal magnetic field.

The MTJ sensor 600 may be fabricated in a magnetron sputtering or an ion beam sputtering system to sequentially deposit the multilayer structure shown in FIG. 6. The first shield (S1) 640 of Ni—Fe having a thickness in the range of 5000–10000 Å is deposited on the substrate 601. The seed layer 610, the AFM1 layer 612, the first pinned layer 618, the first tunnel barrier layer 620, and the first free layer 622 are sequentially deposited over the first shield 640 in the presence of a longitudinal or transverse magnetic field of about 40 Oe to orient the easy axes of all the ferromagnetic layers. The seed layer 610 is a layer deposited to modify the crystallographic texture or grain size of the subsequent layers, and may not be needed depending on the material of the subsequent layer. If used, the seed layer may be formed of tantalum (Ta), zirconium (Zr), or nickel-iron (Ni—Fe) having a thickness of about 30–50 Å. The AFM1 layer 612 formed of $Mn_{50}$—$Fe_{50}$, or alternatively, of $Ir_{20}$—$Mn_{80}$, having a thickness of about 100 Å is deposited on the seed layer 610. The ferromagnetic first pinned layer 618 may be formed of Ni—Fe having a thickness in the range of about 20–50 Å, or alternatively, may be formed of a sub-layer of Ni—Fe having a thickness in the range of 20–50 Å deposited on the AFM1 layer 612 and an interface layer of cobalt (Co) having a thickness of about 5 Å deposited on the Ni—Fe sub-layer. The first tunnel barrier layer 620 is formed of $Al_2O_3$ by depositing and then plasma oxidizing an 8–20 Å aluminum (Al) layer on the first pinned layer 618. The ferromagnetic first free layer 622 may be formed of Ni—Fe having a thickness of 20–50 Å, or alternatively, may be formed of an interface layer of Co having a thickness of about 5 Å deposited on the first tunnel barrier layer 620 and a sub-layer of Ni—Fe having a thickness in the range of 20–50 Å deposited on the Co interface layer.

The first MTJ stack 602 is defined in the central region 662 by depositing a photoresist and using photolithography and ion milling processes well known in the art. The first insulator layers 650 and 652 can now be deposited on the exposed first shield 640 in the end regions 664 and 666, respectively. The first insulator layers 650 and 652 are formed of $Al_2O_3$ by depositing and then plasma oxidizing an Al layer having a thickness approximately equal to the total thickness of the first MTJ stack 602. The photoresist protecting the first MTJ stack 602 is then removed and the common electrode 642 of gold (Au) having a thickness in the range of 200–300 Å is deposited on the exposed first MTJ stack 602 and on the first insulator layers 650 and 652.

The second MTJ stack 604 is formed by sequentially depositing the ferromagnetic second free layer 624, the second tunnel barrier layer 626, the ferromagnetic second pinned layer 628, the AFM2 layer 630, and the cap layer 632 over the common electrode 642 in the presence of a longitudinal or transverse magnetic field of about 40 Oe to orient the easy axes of all the ferromagnetic layers. The second free layer 624 may be formed of Ni—Fe having a thickness in the range of about 20–50 Å, or alternatively, may be formed of a sub-layer of Ni—Fe having a thickness in the range of 20–50 Å deposited on the common electrode 642 and an interface layer of Co having a thickness in the range of 5 Å deposited on the Ni—Fe sub-layer. The second tunnel barrier layer 626 is formed of $Al_2O_3$ by depositing and then plasma oxidizing an 8–20 Å Al layer on the the second free layer 624. The ferromagnetic second pinned layer 628 may be formed of Ni—Fe having a thickness in the range of 20–50 Å deposited on the second tunnel barrier layer 626, or alternatively, may be formed of an interface layer of Co having a thickness of about 5 Å deposited on the second tunnel barrier layer 626 and a sub-layer of Ni—Fe having a thickness in the range of 20–50 Å deposited on the Co interface layer. The AFM2 layer 630 formed of $Ni_{50}$—$Mn_{50}$, or alternatively, of Pt—Mn or Pt—Pd—Mn, having a thickness of about 100 Å is deposited on the second pinned layer 628. The cap layer 632 formed of tantalum (Ta) having a thickness in the range of 20–50 Å is deposited on the AFM2 layer 630.

The second MTJ stack 604 is defined in the central region 662 by depositing a photoresist and using photolithography and ion milling processes well known in the art. The second insulator layers 654 and 656 can now be deposited on the exposed common electrode 642 in the end regions 664 and 666, respectively. The second insulator layers 654 and 656 are formed of $Al_2O_3$ by depositing and then plasma oxidizing an Al layer having a thickness approximately equal to the total thickness of the second MTJ stack 604. The photoresist protecting the second MTJ stack 604 is then removed and the second shield (S2) 644 of Ni—Fe having a thickness in the range of 5000–10000 Å is deposited on the exposed second MTJ stack 604 and on the second insulator layers 654 and 656.

Referring again to FIG. 6, the first shield (S1) 640 and the common electrode 642 provide electrical connections for the flow of sensing current I1 to the first MTJ stack 602. In the first MTJ stack 602, the flow of the sensing current I1 is in a direction perpendicular to the plane of the first tunnel barrier layer 620 as shown by arrow 670. First insulator layers 650 and 652 provide electrical insulation in the end regions 664 and 666, respectively, preventing shunting of the sensing current I1 around the first MTJ stack 602. The second shield (S2) 644 and the common electrode 642 provide electrical connections for the flow of sensing current I2 to the second MTJ stack 604. In the second MTJ stack 604, the flow of the sensing current I2 is in a direction perpendicular to the plane of the second tunnel barrier layer 626 as shown by the arrow 672. Second insulator layers 654 and 656 provide electrical insulation in the end regions 664 and 666, respectively, preventing shunting of the sensing current I2 around the second MTJ stack 604.

After the MTJ sensor 600 fabrication process has been completed, the magnetizations of the pinned layers 618 and 628 of the first MTJ stack 602 and the second MTJ stack 604, respectively, must be fixed in an antiparallel orientation by an initialization process. With the magnetizations of pinned layers 618 and 628 fixed perpendicular to the ABS and antiparallel with respect to each other as shown by arrows 619 and 629 (head and tail of arrows pointing out of and into the plane of the paper, respectively), respectively, the magnetoresistive signal generated due to an external field from the disk by the first MTJ stack 602 will differ in phase by 180° with respect to the magnetoresistive signal generated due to the same external field by the second MTJ stack 604.

The AFM1 layer 612 material is chosen to have a blocking temperature (the blocking temperature is the temperature at which the exchange coupling becomes zero) lower than the blocking temperature of the AFM2 layer 630 material. The AFM2 layer 630 is first oriented by heating the MTJ sensor 600 above the blocking temperature, $T_{B2}$, of the AFM2 material (the blocking temperature of $Ni_{50}$—$Mn_{50}$ is approximately 250° C.) and then with an external magnetic field greater than about 5000 Oe applied perpendicular to the ABS, cooling the sensor. The AFM1 layer 612 is then reset by locally heating the AFM1 material above its blocking temperature, $T_{B1}$, (the blocking temperature of $Mn_{50}$—$Fe_{50}$ is about 150° C.) by applying a voltage pulse across the MTJ1 stack 602 to cause resistive heating to a temperature above $T_{B1}$ but below $T_{B2}$ and then with an external magnetic field greater than about 5000 Oe applied perpendicular to the ABS and antiparallel to the field applied to set the AFM2 layer 630, cooling the sensor. The external magnetic fields applied during the settings of the AFM1 layer 612 and the AFM2 layer 630 are antiparallel in order to set the magnetizations of the first pinned layer 618 and the second pinned layer 628 antiparallel with respect to each other.

Figure 7:
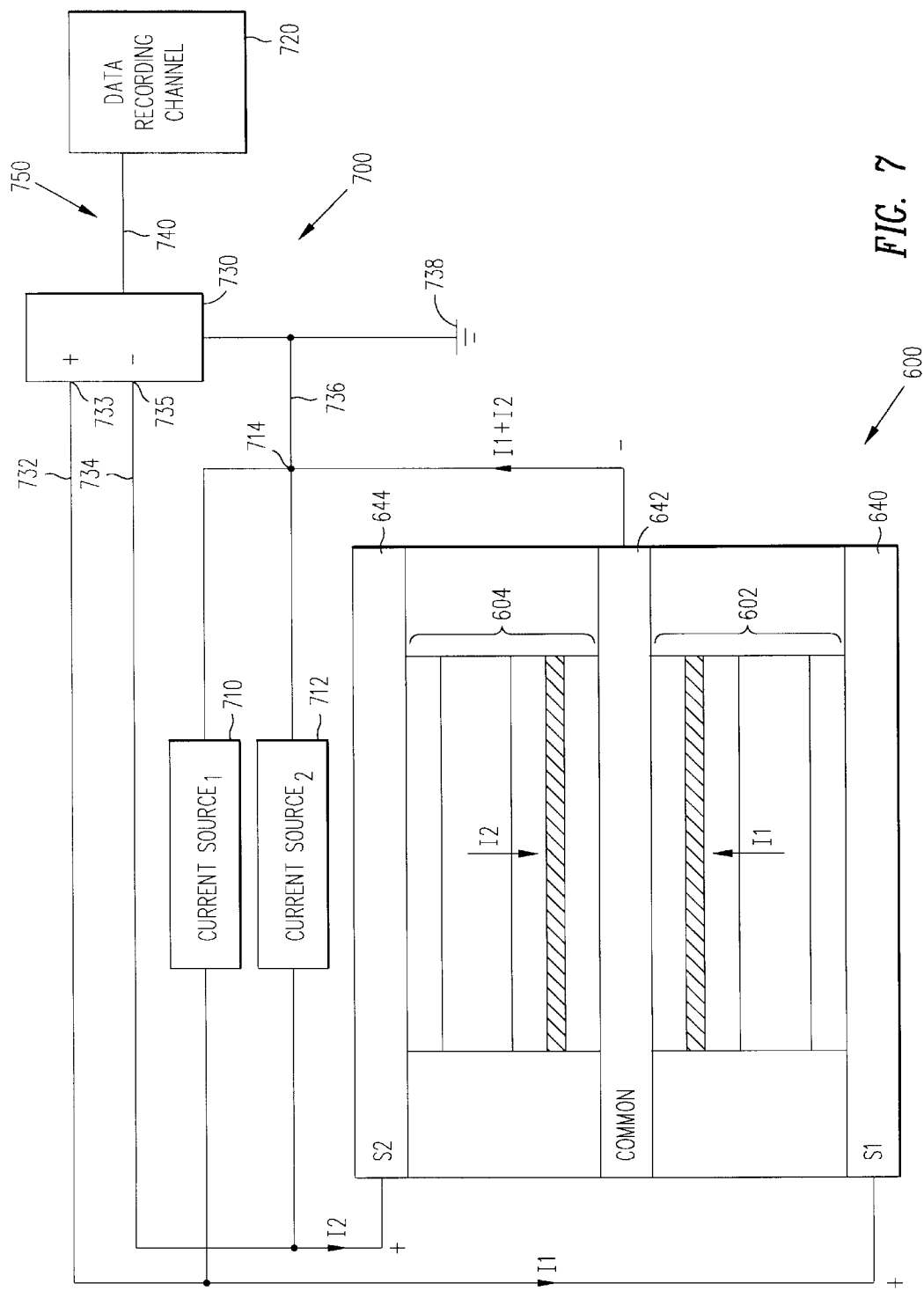
FIG. 7 is a schematic diagram illustrating a thermal asperity reduction method and means according to the preferred embodiment of the present invention.

FIG. 7 shows a schematic diagram of a thermal asperity reduction circuitry 700 according to the preferred embodiment of the present invention. Circuitry 700 comprises MTJ sensor 600 having first shield (S1) 640 and second shield (S2) 644 electrodes and a common electrode 642, a first current source 710, a second current source 712, and a differential circuit 730. The differential circuit 730 includes a first input terminal 733, a second input terminal 735, an output terminal 740, and a ground (reference) terminal 738.

Referring back to FIG. 7, the first current source 710 is connected to the first shield (S1) 640 and to the common electrode 642 to provide the sense current I1 to the first MTJ stack 602. The second current source 712 is connected to the second shield (S2) 644 and to the common electrode 642 to provide the sense current I2 to the second MTJ stack 604. Currents I1 and I2 are adjusted so that with no external magnetic field (signal field) present, the product of the first MTJ stack resistance times I1 (i.e, the voltage drop across the first MTJ stack) is equal to the product of the second MTJ sensor resistance times I2 (the voltage drop across the second MTJ stack).

The first shield (S1) 640 is also connected, via the wire 732, to the first input terminal 733 of the differential circuit 730 and the second shield (S2) 644 is also connected, via the wire 734, to the second input terminal 735 of the differential circuit 730. The common electrode is preferably connected to a common wiring pad 714. The common pad 714 in turn is connected, via wire 736, to the ground 738 of the differential circuit 730. The output terminal 740 of the differential circuit 730 is then connected to the data recording channel 720 for further processing of the detected signals according to the description of FIG. 4. The recording channel 720 and the differential circuit 730 together are referred to as the recording system 750. Differential circuit 730 is preferentially a silicon-based high-speed differential amplifier integrated into the same silicon chip that the data recording channel 720 is integrated into. Differential circuit 730 further has a differential gain such that the output voltage at node 740 due to the difference between the voltages applied to its first and second input terminals 733 and 735 can be expressed in terms of:

$$V_{740} = A*(V_{733} - V_{735})$$

where A is the differential gain of the differential circuit 730. The design of a differential amplifier is known to one of ordinary skill in the art.

Figure 8A:
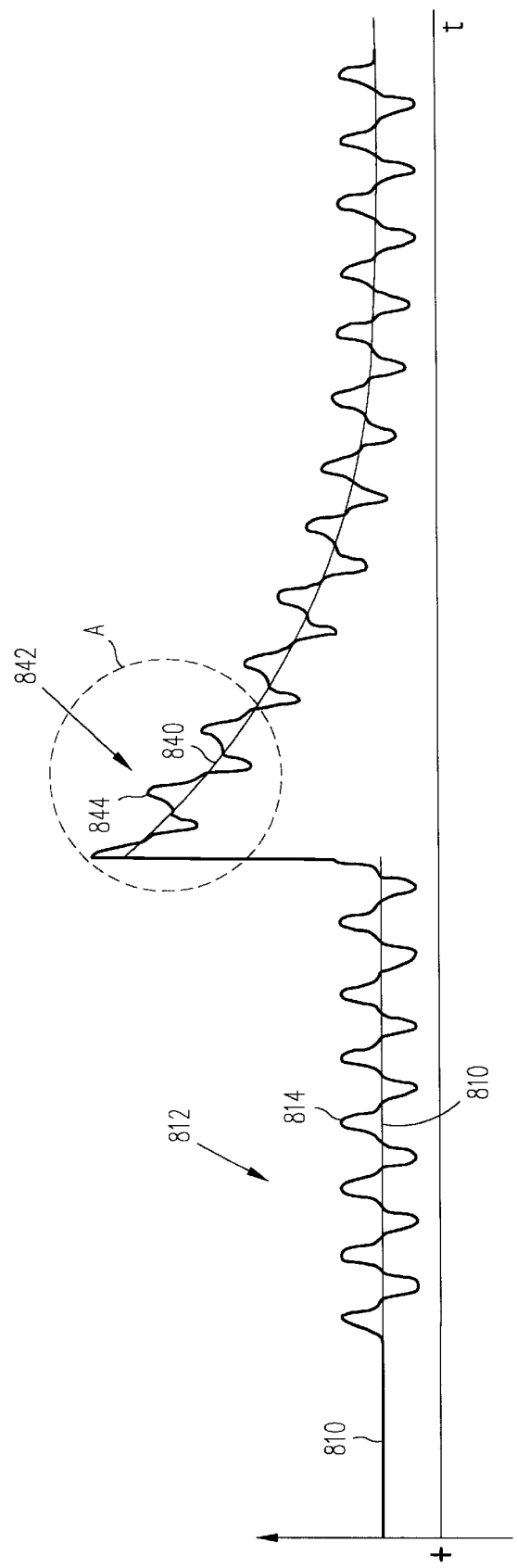

Now referring to FIGS. 8a, 8b, and 8c, there are shown the voltage signals present at the first input terminal 733, the second input terminal 735, and the output terminal 740, respectively, of the differential amplifier 730 under DC bias condition, in the presence of data fields from a magnetic disk, and in the presence of a thermal asperity and data fields from a magnetic disk. Now referring to FIGS. 7 and 8a–8c, under the DC bias condition (no external field is present) the voltage at the first input terminal 733 is a DC voltage 810 which is $R_{MTJ1}$*I1, the voltage at the second input terminal 735 is a DC voltage 820 which is $R_{MTJ2}$*I2, and the voltage at the output terminal 740 is a DC voltage 830.

In the presence of a field, such as a data field from a magnetic disk, the voltage across the MTJ stacks changes because of the change in the resistances of the tunnel barrier layers 620 and 626. The voltage developed across the first MTJ stack 602 as a result of the change in the resistance of the first tunnel barrier layer 620 in the presence of a data field is represented in the form of an AC signal. Consequently, the voltage signal at the first input terminal 733 which is connected to the first shield 640 is voltage 812 which has an AC component 814 and a DC component 810. The AC component, as mentioned above, is due to the change of resistance of the first tunnel barrier layer 620 in the presence of the field from the disk and is:

$$I1*\Delta R_{MTJ1}$$

and the DC component, as described above is:

$$I1*R_{MTJ1}$$

such that:

$$V_{812}=I1*\Delta R_{MTJ1}+I1*R_{MTJ1}.$$

Similarly, the voltage developed across the second MTJ stack 604 as a result of the change in the resistance of the second tunnel barrier layer 626 in the presence of a data field is represented in a form of an AC signal. Consequently, the voltage signal at the second input terminal 735 which is connected to the second shield 644 is voltage 822 which has an AC component 824 and a DC component 820. The AC component, as mentioned above, is due to the change of resistance of the second tunnel barrier layer 626 in the presence of the field from the disk and is:

$$I2*\Delta R_{MTJ2}$$

and the DC component, as described above is:

$$I2*R_{MTJ2}$$

such that:

$$V_{822}=I2*\Delta R_{MTJ2}+I2*R_{MTJ2}.$$

However, it should be noted that due to the antiparallel orientation of the magnetization directions 619 and 629 of the pinned layers in the two MTJ stacks 602 and 604, respectively, there is a phase difference of 180° between the AC components 814 and 824 of the voltages 812 and 822, respectively.

In the presence of a field from the disk, the voltage at the output terminal 740 will be equal to the difference between the voltage signals at the first and second input terminals 733 and 735 times the differential gain of the circuit 730 as shown below:

$$V_{740}=A*(V_{733}-V_{735})$$

$$V_{832}=A*(V_{812}-V_{822})$$

$$V_{832}=A*(I1*\Delta R_{MTJ1}+I1*R_{MTJ1}-I2*\Delta R_{MTJ2}-I2*R_{MTJ2}).$$

Since the currents I1 and I2 are chosen such that $I1*R_{MTJ1}=I2 * R_{MTJ2}$, the contributions from the above two signals cancel each other and:

$$V_{832}=A*(I1*\Delta R_{MTJ1}-I2*\Delta R_{MTJ2}).$$

It should be noted that because the magnetoresistive signal from the second MTJ stack 604 is 180° out of phase with the magnetoresistive signal from the first MTJ stack 602, the amplitude of the AC voltage 834 at the output terminal 740 is the sum of the amplitudes of the AC voltages 814 and 824 at the input terminals 733 and 735.

Now assume that a thermal asperity phenomenon takes place while reading data from a track of a disk causing the temperature of the MTJ sensor 600 to increase. Under such condition, the voltage at the first input terminal 733 would be a voltage 842 which has an AC component 844 and a DC component 840. The AC component is due to the change in the resistance of the first tunnel barrier layer 620 in the presence of the field from the disk and is $I1*\Delta R_{MTJ1}$.

The DC component 840, which is represented by a sudden shift in the DC voltage followed by an exponential decay in the shifted DC voltage is $I1*R_{MTJ1}$ such that:

$$V_{842}=I1\Delta R_{MTJ1}+I1*R_{MTJ1}.$$

In the presence of the thermal asperity, the voltage at the second input terminal 735 would be a voltage 852 which has an AC component 854 and a DC component 850 such that:

$$V_{852}=I2*\Delta R_{MTJ2}+I2*R_{MTJ2}.$$

Now, under the condition of a thermal asperity phemomenon while reading data from a disk, the voltage at the output terminal 740 will be equal to the difference between the voltage signals at the first and second input terminals 733 and 735 times the differential gain of the circuit 730 as shown below:

$$V_{740}=A*(V_{733}-V_{735})$$

$$V_{862}=A*(V_{842}-V_{852})$$

$$V_{862}=A*(I1*\Delta R_{MTJ1}+I1*R_{MTJ1}-I2*\Delta R_{MTJ2}-I2*R_{MTJ2}).$$

Figure 9:
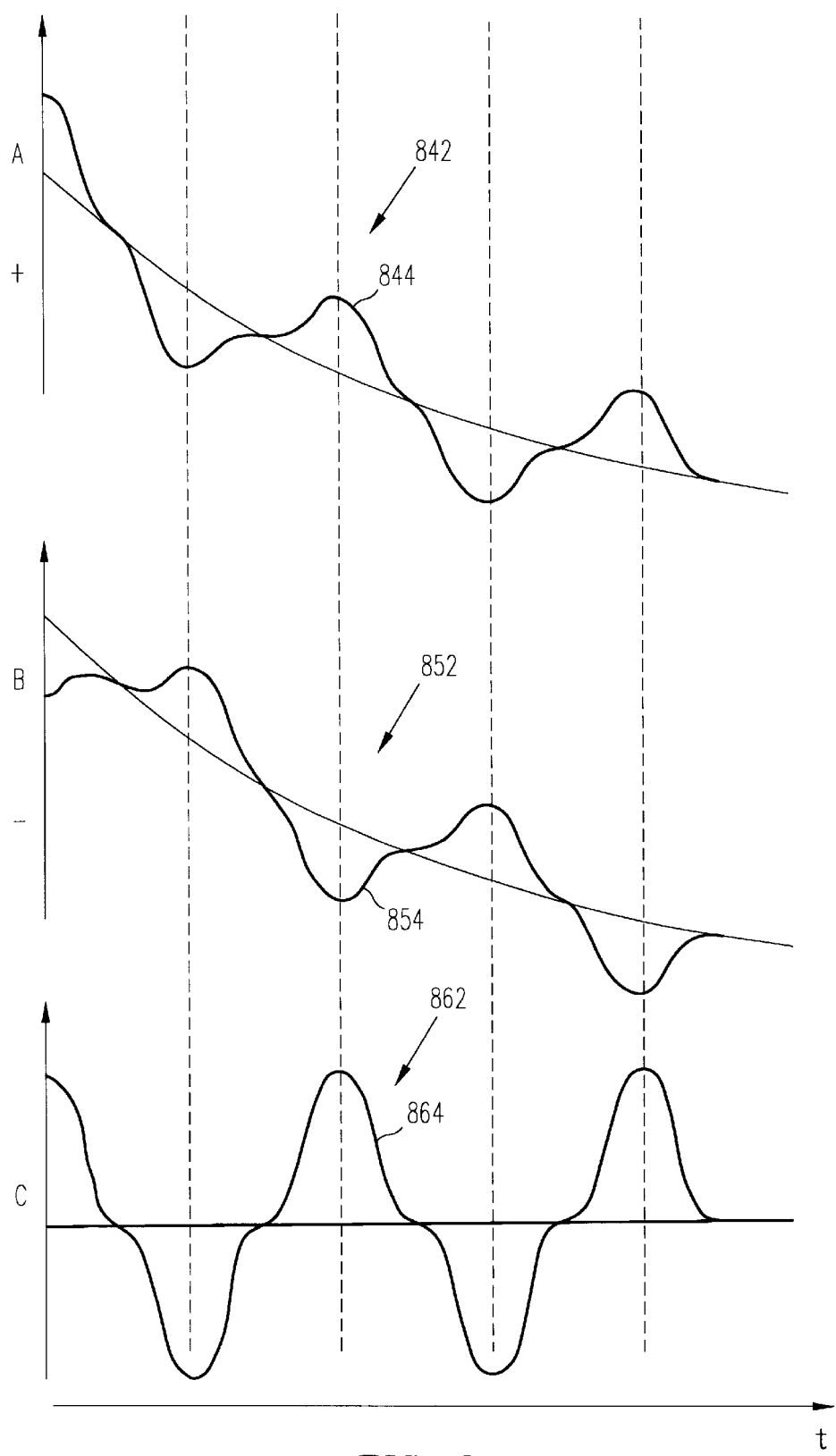
FIG. 9 is a graph illustrating amplified portions A, B and C of the signals from FIGS. 8a, 8b and 8c, respectively, in the presence of thermal asperity and data signal and showing the phase relationship of the signals.

FIG. 9 is a graph showing portions A, B and C of FIGS. 8a, 8b and 8c, respectively, to better illustrate the phase relationships of the voltages at the input terminals 733 and 735 and the resulting voltage at the output terminal 740 of the differential circuit 730.

Since the currents I1 and I2 are chosen such that $I1*R_{MTJ1}=I2 * R_{MTJ2}$, and since the first and second MTJ stacks 602 and 604 have equivalent structures and the same thermal coefficient, the thermal asperity signal developed across the first MTJ stack 602 and the second MTJ stack 604 are substantially of the same shape, magnitude and phase. Therefore, the terms $I1*R_{MTJ1}$ and $I2 * R_{MTJ2}$ cancel each other which means:

$$V_{862}=A*(I1*\Delta R_{MTJ1}-I2*\Delta R_{MTJ2}).$$

Because the magnetoresistive signal from the second MTJ stack 604 is 180° out of phase with the magnetoresistive signal from the first MTJ stack 602, the amplidude of the AC voltage 864 at the output terminal 740 is the sum of the amplitudes of the AC voltages 844 and 854 at the input terminals 733 and 735, respectively, as shown in curve C of FIG. 9.

Note that in the actual implementation a narrow signal spike 870 is usually present at the output terminal 740 at the onset of the sudden shift in the DC voltage due to finite physical mismatches present between: (1) the resistances of the first and second MTJ stacks 602 and 604, (2) the resistance of the first and second MTJ stack leads, (3) the first current source 710 and the second current source 712, and (4) internal mismatches of the differential circuit. However, this spike is generally only a few bits long which does not cause any loss of data.

Figure 10:
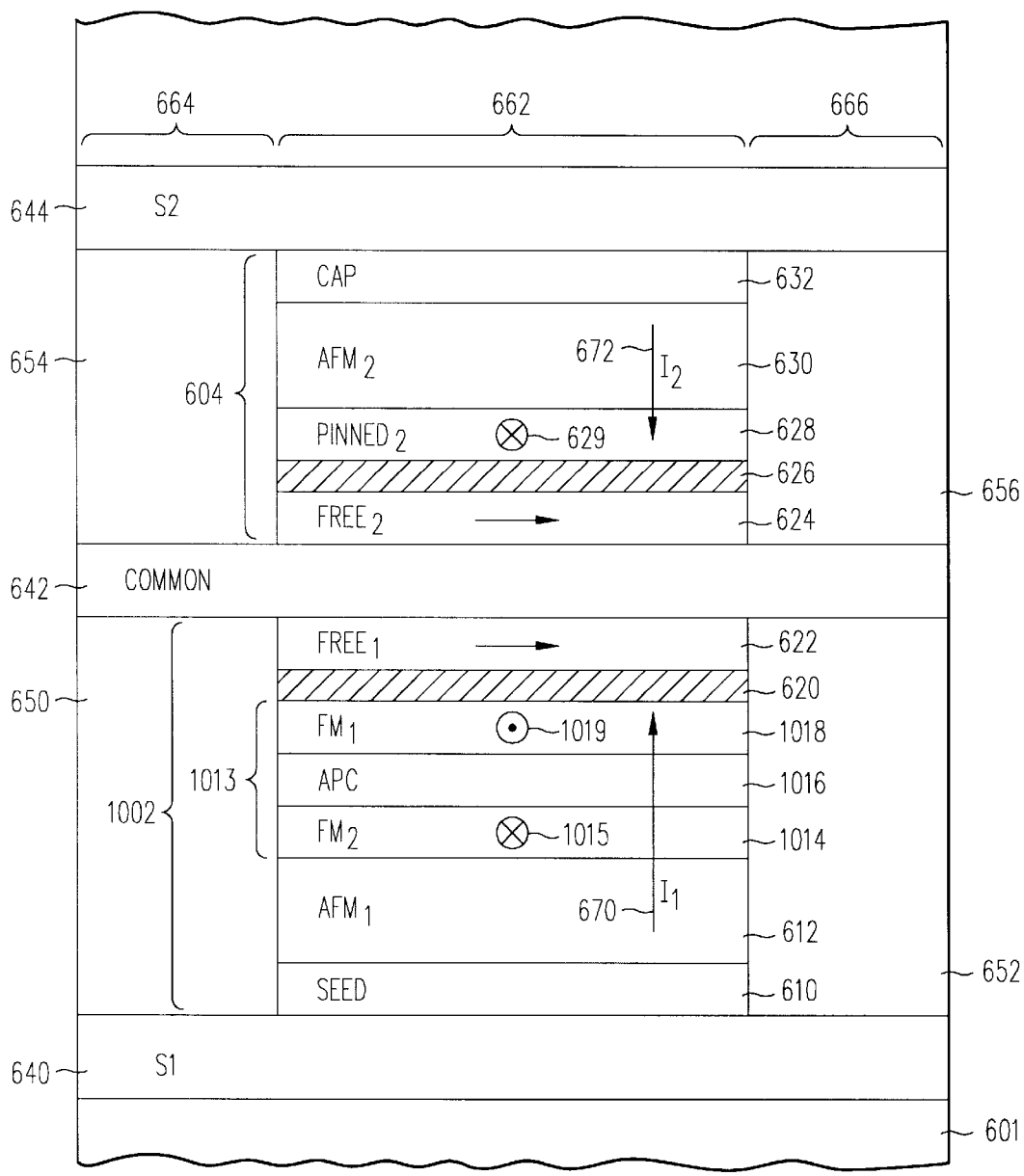
FIG. 10 is an air bearing surface view, not to scale, of an alternate embodiment of the magnetic tunnel junction sensor of the present invention.

Referring now to FIG. 10, there is shown an air bearing surface (ABS) view, not to scale, of an MTJ sensor 1000 of an alternative embodiment to the present invention. MTJ sensor 1000 is substantially the same a MTJ sensor 600 described above except that MTJ sensor 1000 includes a first MTJ stack 1002 formed in the central region 662 having a laminated antiparallel (AP) pinned layer 1013. The laminated AP-pinned layer 1013 comprises a first ferromagnetic sublayer (FM1) 1018 of Ni—Fe having a thickness in the range of 20–50 Å, a second ferromagnetic sublayer (FM2) 1014 of Ni—Fe having a thickness in the range of 20–50 Å, and an antiparallel coupling (APC) layer 1016 disposed between the FM1 sublayer 1018 and the FM2 sublayer 1014. The APC layer 1016 is formed of a non-magnetic material, preferably ruthenium (Ru), that allows the FM1 sublayer 1018 and the FM2 sublayer 1014 to be strongly coupled together antiferromagnetically. The FM2 sublayer 1014 is formed on the first antiferromagnet (AFM1) layer 612. The AFM1 layer 612 is exchange coupled to the FM2 sublayer 1014 providing an exchange field to pin the magnetization direction of the FM2 sublayer 1014 perpendicular to the ABS. The first tunnel barrier layer 620 is formed on the FM1 sublayer 1018.

A novel feature of the MTJ sensor 1000 of the alternative embodiment of the invention using the laminated AP-pinned layer 1013 is that the initialization process needed to fix the magnetization directions of the pinned layers of the first MTJ stack 1002 and the second MTJ stack 604 antiparallel with respect to each other is simplified. The initialization process for MTJ sensor 1000 comprises a step in which the magnetization directions of both AFM1 612 and AFM2 630 are set in the same direction by heating and then cooling the entire MTJ sensor 1000 above the blocking temperatures of both the AFM1 and the AFM2 materials with a 5000 Oe field applied in the desired direction. After the initialization process, the FM2 sublayer 1014 and the second pinned layer 628 will have their magnetization directions 1015 and 629, respectively, oriented perpendicular to the ABS and parallel to one another. Because of the APC layer 1016, the magnetization direction 1019 of the FM1 sublayer 1018 will be oriented perpendicular to the ABS and antiparallel to the magnetization direction 1015 of the FM2 sublayer 1014 and perpendicular to the magnetization direction 629 of the second pinned layer 628. With the magnetizations of the FM1 sublayer 1018 and the second pinned layer 628 fixed perpendicular to the ABS and antiparallel with respect to each other as shown by arrows 1019 and 629 (head and tail of arrows pointing out of and into the plane of the paper, respectively), respectively, the magnetoresistive signal generated due to an external field from the disk by the first MTJ stack 1002 will differ in phase by 180° with respect to the magnetoresistive signal generated due to the same external field by the second MTJ stack 604.

In the MTJ sensor 1000 of the alternative embodiment of the present invention, because both the AFML layer 612 and the AFM2 layer 630 are initialized by a single heating step, the blocking temperature of the AFM1 material is no longer required to be lower than the blocking temperature of of the AFM2 material. Therefore, in the alternate embodiment both the AFM1 layer 612 and the AFM2 layer 630 may be chosen from a group of materials consisting of Mn—Fe, Ni—Mn, Ir—Mn, Pt—Mn and Pt—Pd—Mn.

In the alternative embodiment of the present invention, MTJ sensor 600 in FIG. 7 is replaced by the alternative MTJ sensor 1000 to provide for thermal asperity detection and reduction utilizing the thermal asperity reduction circuitry 700.

While the present invention has been particularly shown and described with reference to the preferred embodiments, it will be understood by those skilled in the art that various changes in form and detail may be made without departing from the spirit, scope and teaching of the invention. Accordingly, the disclosed invention is to be considered merely as illustrative and limited in scope only as specified in the appended claims.

I claim:

1. A magnetic tunnel junction (MTJ) sensor, comprising:
   a first MTJ (MTJ1) stack, said MTJ1 stack having:
     a ferromagnetic free layer;
     a ferromagnetic pinned layer;
     a tunnel barrier layer disposed between said free layer and said pinned layer; and
     an antiferromagnetic (AFM1) layer in contact with said ferromagnetic pinned layer for pinning the magnetization of said pinned layer;
   a second MTJ (MTJ2) stack, said MTJ2 stack having:
     a ferromagnetic free layer;
     a ferromagnetic pinned layer;
     a tunnel barrier layer disposed between said free layer and said pinned layer; and
   an antiferromagnetic (AFM2) layer in contact with said ferromagnetic pinned layer for pinning the magnetization of said pinned layer;
   a common electrode disposed between said MTJ1 stack and said MTJ2 stack;
   a first shield (S1) in contact with said MTJ1 stack for providing a first sense current to said MTJ1 stack; and
   a second shield (S2) in contact with said MTJ2 stack for providing a second sense current to said MTJ2 stack.

2. An MTJ sensor as recited in claim 1 wherein said pinned layers are selected from a group of materials consisting of Ni—Fe and Ni—Fe/Co.

3. An MTJ sensor as recited in claim 1 wherein said free layers are selected from a group of materials consisting of Ni—Fe and Ni—Fe/Co.

4. An MTJ sensor as recited in claim 1 wherein said tunnel barrier layers are made of $Al_2O_3$.

5. An MTJ sensor as recited in claim 1 wherein said AFM1 layer is selected from a group of materials consisting of Mn—Fe and Ir—Mn.

6. An MTJ sensor as recited in claim 1 wherein said AFM2 layer is selected from a group of materials consisting of Ni—Mn, Pt—Mn and Pt—Pd—Mn.

7. An MTJ sensor as recited in claim 1 wherein said common electrode is made from gold (Au).

8. An MTJ sensor as recited in claim 1 wherein said first and second shields are selected from a group of materials consisting of Ni—Fe and Al—Fe—Si.

9. An MTJ sensor as recited in claim 1 wherein the magnetization direction of the pinned layer in said first MTJ stack is antiparallel to the magnetization direction of the pinned layer in said second MTJ stack.

10. A disk drive system comprising:
    a magnetic recording disk;
    a magnetic tunnel junction (MTJ) sensor for sensing magnetically recorded data on said magnetic recording disk, said MTJ sensor comprising:
      a first MTJ (MTJ1) stack, said MTJ1 stack having:
        a ferromagnetic free layer;
        a ferromagnetic pinned layer;

a tunnel barrier layer disposed between said free layer and said pinned layer; and
an antiferromagnetic (AFM1) layer in contact with said ferromagnetic pinned layer for pinning the magnetization of said pinned layer;
a second MTJ (MTJ2) stack, said MTJ2 stack having:
a ferromagnetic free layer;
a ferromagnetic pinned layer;
a tunnel barrier layer disposed between said free layer and said pinned layer; and
an antiferromagnetic (AFM2) layer in contact with said ferromagnetic pinned layer for pinning the magnetization of said pinned layer;
a common electrode disposed between said MTJ1 stack and said MTJ2 stack;
a first shield (S1) in contact with said MTJ1 stack for providing a first sense current to said MTJ1 stack; and
a second shield (S2) in contact with said MTJ2 stack for providing a second sense current to said MTJ2 stack;
an actuator for moving said MTJ sensor across the magnetic recording disk so the MTJ sensor may access different regions of magnetically recorded data on the magnetic recording disk; and
a recording channel coupled electrically to the MTJ sensor for detecting changes in resistance of the MTJ sensor caused by rotation of the magnetization axis of the free ferromagnetic layers relative to the fixed magnetization of the pinned layers in response to magnetic fields from the magnetically recorded data.

11. A disk drive system as recited in claim 10 wherein said pinned layers are selected from a group of materials consisting of Ni—Fe and Ni—Fe/Co.

12. A disk drive system as recited in claim 10 wherein said free layers are selected from a group of materials consisting of Ni—Fe and Ni—Fe/Co.

13. A disk drive system as recited in claim 10 wherein said tunnel barrier layers are made of $Al_2O_3$.

14. A disk drive system as recited in claim 10 wherein said AFM1 layer is selected from a group of materials consisting of Mn—Fe and Ir—Mn.

15. A disk drive system as recited in claim 10 wherein said AFM2 layer is selected from a group of materials consisting of Ni—Mn, Pt—Mn and Pt—Pd—Mn.

16. A disk drive system as recited in claim 10 wherein said common electrode is made from gold (Au).

17. A disk drive system as recited in claim 10 wherein said first and second shields are selected from a group of materials consisting of Ni—Fe and Al—Fe—Si.

18. A disk drive system as recited in claim 10 wherein the magnetization direction of the pinned layer in said first MTJ stack is antiparallel to the magnetization direction of the pinned layer in said second MTJ stack.

19. A disk drive system as recited in claim 10, wherein said recording channel further comprises a differential circuit having first and second input terminals connected to the MTJ1 stack and to the MTJ2 stack for detecting and compensating for resistance changes in said MTJ1 and MTJ2 stacks responsive to a thermal asperity phenomena during reading data in said disk drive system.

20. A magnetic tunnel junction (MTJ) sensor, comprising:
a first MTJ (MTJ1) stack, said MTJ1 stack having:
a ferromagnetic free layer;
a laminated antiparallel (AP) pinned layer, said AP-pinned layer comprising a first ferromagnetic sublayer (EM1), a second ferromagnetic sublayer (FM2) and an antiparallel coupling (APC) layer disposed between said FM1 sublayer and said FM2 sublayer;
a tunnel barrier layer disposed between said free layer and said FM1 sublayer; and
an antiferromagnetic (AFM1) layer in contact with said FM2 sublayer for pinning the magnetization of said FM2 sublayer;
a second MTJ (MTJ2) stack, said MTJ2 stack having:
a ferromagnetic free layer;
a ferromagnetic pinned layer;
a tunnel barrier layer disposed between said free layer and said pinned layer; and
an antiferromagnetic (AFM2) layer in contact with said ferromagnetic pinned layer for pinning the magnetization of said pinned layer;
a common electrode disposed between said MTJ1 stack and said MTJ2 stack;
a first shield (S1) in contact with said MTJ1 stack for providing a first sense current to said MTJ1 stack; and
a second shield (S2) in contact with said MTJ2 stack for providing a second sense current to said MTJ2 stack.

21. An MTJ sensor as recited in claim 20 wherein said FM1 and FM2 sublayers are selected from a group of materials consisting of Ni—Fe and Ni—Fe/Co.

22. An MTJ sensor as recited in claim 20 wherein said APC layer is made of ruthenium (Ru).

23. An MTJ sensor as recited in claim 20 wherein said free layers are selected from a group of materials consisting of Ni—Fe and Ni—Fe/Co.

24. An MTJ sensor as recited in claim 20 wherein said tunnel barrier layers are made of $Al_2O_3$.

25. An MTJ sensor as recited in claim 20 wherein said AFM1 and AFM2 layers are selected from a group of materials consisting of Mn—Fe, Ni—Mn, Ir—Mn, Pt—Mn and Pt—Pd—Mn.

26. An MTJ sensor as recited in claim 20 wherein said common electrode is made from gold (Au).

27. An MTJ sensor as recited in claim 20 wherein said first and second shields are selected from a group of materials consisting of Ni—Fe and Al—Fe—Si.

28. An MTJ sensor as recited in claim 20 wherein the magnetization direction of the FM1 sublayer in said first MTJ stack is antiparallel to the magnetization direction of the pinned layer in said second MTJ stack.

29. A disk drive system comprising:
a magnetic recording disk;
a magnetic tunnel junction (MTJ) sensor for sensing magnetically recorded data on said magnetic recording disk, said MTJ sensor comprising:
a first MTJ (MTJ1) stack, said MTJ1 stack having:
a ferromagnetic free layer;
a laminated antiparallel (AP) pinned layer, said AP-pinned layer comprising a first ferromagnetic sublayer (FM1), a second ferromagnetic sublayer (FM2), and an antiparallel coupling (APC) layer disposed between said FM1 sublayer and said FM2 sublayer;
a tunnel barrier layer disposed between said free layer and said FM1 sublayer; and
an antiferromagnetic (AFML) layer in contact with said FM2 sublayer for pinning the magnetization of said FM2 sublayer;
a second MTJ (MTJ2) stack, said MTJ2 stack having:
a ferromagnetic free layer;
a ferromagnetic pinned layer;
a tunnel barrier layer disposed between said free layer and said pinned layer; and
an antiferromagnetic (AFM2) layer in contact with said ferromagnetic pinned layer for pinning the magnetization of said pinned layer;

a common electrode disposed between said MTJ1 stack and said MTJ2 stack;

a first shield (S1) in contact with said MTJ1 stack for providing a first sense current to said MTJ1 stack; and a second shield (S2) in contact with said MTJ2 stack for providing a second sense current to said MTJ2 stack;

an actuator for moving said MTJ sensor across the magnetic recording disk so the MTJ sensor may access different regions of magnetically recorded data on the magnetic recording disk; and a recording channel coupled electrically to the MTJ sensor for detecting changes in resistance of the MTJ sensor caused by rotation of the magnetization axis of the free ferromagnetic layers relative to the fixed magnetization of the pinned layers in response to magnetic fields from the magnetically recorded data.

30. A disk drive system as recited in claim 29 wherein said FM1 and FM2 sublayers are selected from a group of materials consisting of Ni—Fe and Ni—Fe/Co.

31. A disk drive system as recited in claim 29 wherein said free layers are selected from a group of materials consisting of Ni—Fe and Ni—Fe/Co.

32. A disk drive system as recited in claim 29 wherein said tunnel barrier layers are made of $Al_2O_3$.

33. A disk drive system as recited in claim 29 wherein said AFM1 and AFM2 layers are selected from a group of materials cosisting of Mn—Fe, Ni—Mn, Ir—Mn, Pt—Mn and Pt—Pd—Mn.

34. A disk drive system as recited in claim 29 wherein said common electrode is made from gold (Au).

35. A disk drive system as recited in claim 29 wherein said first and second shields are selected from a group of materials consisting of Ni—Fe and Al—Fe—Si.

36. A disk drive system as recited in claim 29 wherein the magnetization direction of the FM1 sublayer in said first MTJ stack is antiparallel to the magnetization direction of the pinned layer in said second MTJ stack.

37. A disk drive system as recited in claim 29, wherein said recording channel further comprises a differential circuit having first and second input terminals connected to the MTJ1 stack and to the MTJ2 stack for detecting and compensating for resistance changes in said MTJ1 and MTJ2 stacks responsive to a thermal asperity phenomena during reading data in said disk drive system.

* * * * *